United States Patent
Bin Hud et al.

(10) Patent No.: US 11,837,532 B2
(45) Date of Patent: Dec. 5, 2023

(54) LEADFRAME WITH DELAMINATION RESISTANT FEATURE

(71) Applicant: Texas Instruments Incorporated, Dallas, TX (US)

(72) Inventors: Amirul Afiq Bin Hud, Melaka (MY); Sueann Wei Fen Lim, Melaka (MY); Adi Irwan Bin Herman, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/743,067

(22) Filed: Jan. 15, 2020

(65) Prior Publication Data
US 2021/0217686 A1    Jul. 15, 2021

(51) Int. Cl.
*H01L 23/495*      (2006.01)
*H01L 23/00*       (2006.01)
(Continued)

(52) U.S. Cl.
CPC .... *H01L 23/49548* (2013.01); *H01L 21/4828* (2013.01); *H01L 21/4842* (2013.01); *H01L 23/3121* (2013.01); *H01L 23/49513* (2013.01); *H01L 23/49568* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01); *H01L 2924/35121* (2013.01)

(58) Field of Classification Search
CPC ... H01L 23/49548; H01L 24/73; H01L 24/32; H01L 23/49513; H01L 23/3121; H01L 23/49568; H01L 21/4828; H01L 24/48; H01L 21/4842; H01L 2224/32245; H01L 2224/48091; H01L 2924/35121; H01L 2224/48106; H01L 2224/73265; H01L 2224/48247
See application file for complete search history.

(56) References Cited

U.S. PATENT DOCUMENTS 6,054,755 A * 4/2000 Takamichi .............. H01L 23/13
                                                    257/667
6,372,539 B1 * 4/2002 Bayan ............... H01L 23/49548
                                                    438/106

(Continued)

*Primary Examiner* — Robert G Bachner
(74) *Attorney, Agent, or Firm* — Ronald O. Neerings; Frank D. Cimino

(57) ABSTRACT

A packaged semiconductor device includes a semiconductor die having a top side including a semiconductor surface layer having circuitry configured for a function coupled to bond pads, and a bottom side. A leadframe includes a die pad and leads or lead terminals on at least two sides of the die pad. At least one non-through hole for delamination prevention is in at least one of the die pad and the lead or the lead terminals. The semiconductor die is mounted by a die attach material with the bottom side down on the die pad. A mold compound provides encapsulation for the package semiconductor device except for at least a bottom side of the lead terminals or sidewalls of the package for the leads. The non-through hole is a filled hole filled with either the die attach material or the mold compound.

31 Claims, 4 Drawing Sheets

(51) Int. Cl.
*H01L 23/31* (2006.01)
*H01L 21/48* (2006.01)

(56) References Cited

U.S. PATENT DOCUMENTS

| | | | |
|---|---|---|---|
| 6,483,178 B1* | 11/2002 | Chuang | H01L 23/3107 |
| | | | 257/672 |
| 2002/0094601 A1 | 7/2002 | Su et al. | |
| 2004/0113262 A1* | 6/2004 | Elliott | H01L 23/4334 |
| | | | 257/706 |
| 2008/0067640 A1* | 3/2008 | Do | H01L 23/49541 |
| | | | 257/E23.039 |
| 2009/0002961 A1* | 1/2009 | Camacho | H01L 23/49861 |
| | | | 361/760 |
| 2012/0205790 A1* | 8/2012 | Haga | H01L 21/4842 |
| | | | 257/676 |
| 2014/0191380 A1* | 7/2014 | Lee | H01L 23/49503 |
| | | | 257/676 |
| 2019/0206770 A1* | 7/2019 | Anis Fauzi | H01L 23/3142 |

* cited by examiner

LEADFRAME WITH DELAMINATION RESISTANT FEATURE

FIELD

This Disclosure relates to leadframes for semiconductor devices having an adhesion feature for reducing delamination, such as between the leadframe and the mold compound, or between the leadframe and a printed circuit board.

BACKGROUND

A variety of semiconductor chip packages are known that provide support for an integrated circuit (IC) chip or an IC die, that provide protection from the environment, and enable surface mounting of the die to and interconnection generally to a printed circuit board (PCB). One conventional package configuration includes a leadframe having a die pad, and lead terminals beyond the die pad on at least two sides of the die pad.

Leadframe semiconductor packages are well-known and widely used in the electronics industry to house, mount, and interconnect a variety of ICs. A conventional leadframe is typically die-stamped from a sheet of flat-stock metal, and includes a plurality of metal leads or lead terminals in the case of leadless packages, temporarily held together in a planar arrangement about a central region during package manufacture by a rectangular frame comprising a plurality of expendable "dam-bars." A mounting pad commonly known as a die pad for supporting a semiconductor die is supported in the central region by "tie-bars" that attach to the frame. The leads or lead terminals extend from a first end integral with the frame to an opposite second end adjacent to, but spaced apart from, the die pad.

Package delamination is a known concern for packaged semiconductor devices. Typically, the areas where delamination occurs are between the die pad and the mold compound and between the leads or lead terminals and the mold compound. The cause of delamination can come from a variety of factors, including when the packaged device is under stress. Known solutions for reducing packaged device delamination include roughening the top surface of the leadframe, and a half-etched leadframe. Moreover, solder joints, such as between the leads or lead terminals of a packaged device and metal land pads on a printed circuit board (PCB), may also crack during temperature cycling, crack during board testing, or crack while operating while in a customer's application.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a leadframe with a delamination resistant feature. Disclosed leadframes include a die pad, and a plurality of leads (for a leaded package) or lead terminals (for a leadless package) on at least two sides of the die pad. At least one of the die pad and the leads or lead terminals include at least one non-through hole that provides the delamination resistant feature. Also disclosed is a packaged semiconductor device including an IC die on a disclosed leadframe.

Disclosed "non-through holes" also known in the field of drilling as "blind holes" as used herein means holes in a workpiece (in the leads or lead terminals, and/or in the die pad) that are not completely through the thickness of the workpiece, thus being hidden from being seen through by material of the workpiece covering the hole. Non-through holes may be contrasted with "through-holes" which extend through a full thickness of the workpiece and thus can be seen through.

BRIEF DESCRIPTION OF THE DRAWINGS

Reference will now be made to the accompanying drawings, which are not necessarily drawn to scale, wherein:

FIG. 1A shows the method starts with a bare leadframe in the form of a roll of sheet metal that is translated by a roller apparatus, where a computerized drilling apparatus that drives a drill bit is used to drill a non-through hole pattern in fixed locations on each leadframe according to the particular package type to provide non-through holes. FIG. 1B is a cross-sectional view of a portion for a die pad of a leadframe that has disclosed non-through holes shown therein after the drilling process depicted in FIG. 1A. Conventional leadframe stamping or etching is then used to form the shape of the lead or lead terminals shown as lead terminals and the die pad according to the package type, with the results shown in FIG. 1C with disclosed non-through holes shown in the top side of the die pad and in the top side of the lead terminals.

DETAILED DESCRIPTION

Figure 1A:
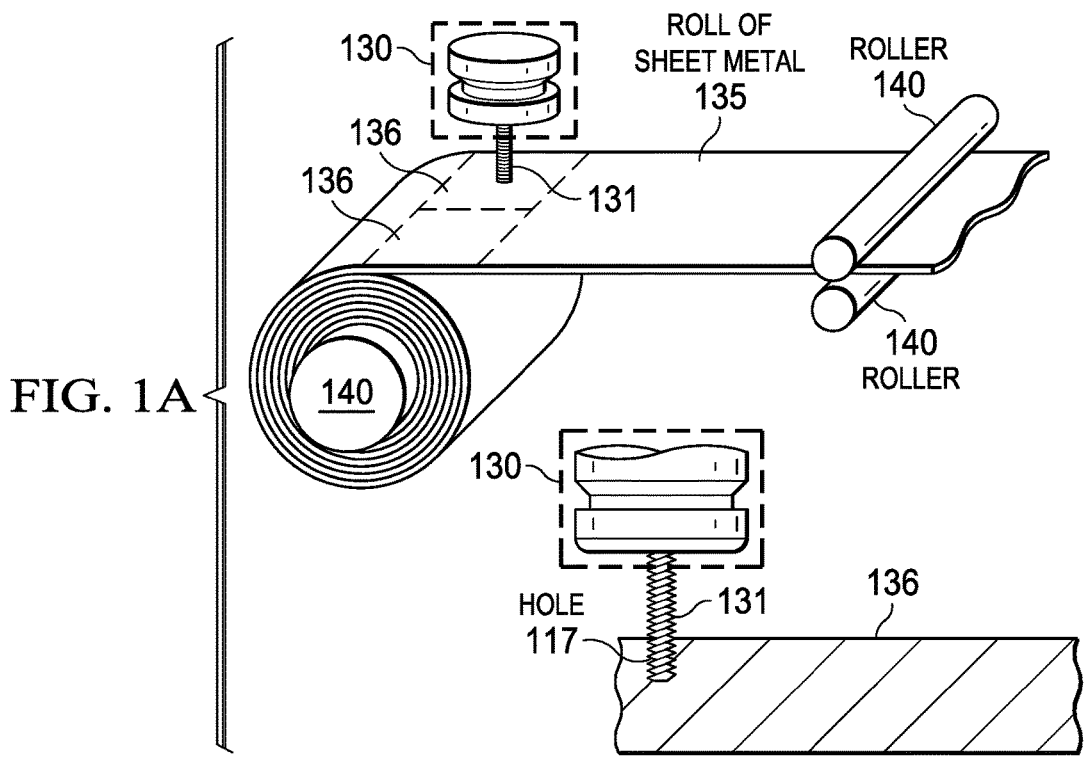
FIGS. 1A-C shows results after successive steps for an example method for forming a disclosed leadframe that has a plurality of non-through holes for delamination prevention, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1B:
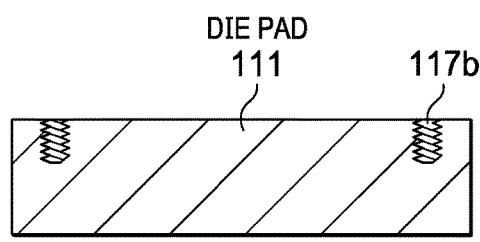
Figure 1C:
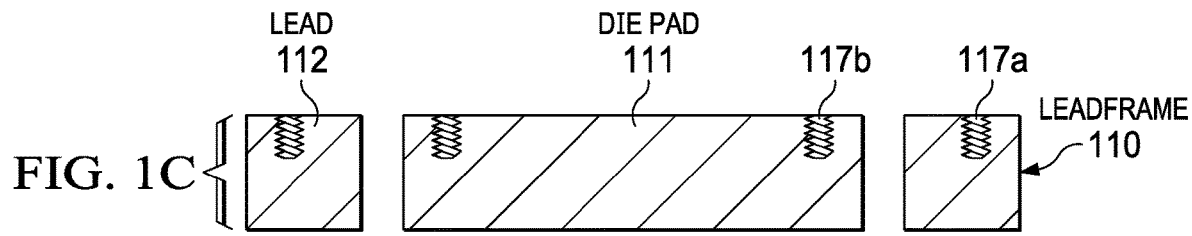

FIG. 1A-C shows results after successive steps for an example method for forming a disclosed leadframe that has a plurality of non-through holes, according to an example aspect. As known in engineering, machining and tooling, a hole in a workpiece may be what is conventionally called a 'non-through hole' or instead a 'through-hole' (or a clearance hole). A non-through hole is a hole that can be reamed, drilled, or milled to a specified depth without breaking through to the other side of the workpiece. A through-hole in contrast to a non-through hole is a hole that goes completely through the full thickness of the workpiece.

As shown in the top depiction of FIG. 1A the method starts with a bare leadframe generally in metal strip form, typically comprising copper or a copper alloy, that is conventionally provided in the form of a roll of sheet metal 135 including a two-dimensional (2D) plurality of leadframe sites 136 that is translated by a roller apparatus 140. A computerized drilling apparatus 130 that drives a drill bit 131 is used to drill a non-through hole, as noted above meaning not a through-hole, where the pattern of non-through holes are generally in fixed locations on each leadframe site 136 according to the particular package type to provide a plurality of non-through holes.

The bottom depiction in FIG. 1A depicts the drill bit 131 rotating while within a leadframe site 136 while forming a non-through hole 117 for delamination resistance extending a distance into the leadframe site 136 in its thickness direction that is less than the thickness of the leadframe site 136. Although the computerized drilling apparatus 130 is shown having a drill bit 131 such as in the case of a computer numerical control (CNC) milling apparatus, disclosed non-through holes 117 may be formed by other drilling processes including laser drilling which utilizes a laser beam, or another form of drilling technology.

The non-through hole in one arrangement is a screw hole. A screw hole as opposed to more generally a simple conventional cylindrical hole with planar bounding surfaces is recognized to provide the benefit of better mold locking as compared to the planar bounding surface of a cylindrical hole.

The typical depth of the non-through holes 117 is about one quarter (25%) of the total thickness of the leadframe, but can generally vary from 10% to 70% of the total thickness of the leadframe. The depth of the non-through hole 117 as used herein includes the drill point in the case of a drill bit 131. The leadframe can be as thin as 0.015 mm to 0.2 mm, although the thickness of the leadframe is typically 0.3 mm to 0.8 mm. The diameter of the non-through holes 117 depends on the diameter of the drill bit 131 in the case of a CNC milling apparatus, or the diameter of the laser beam in the case of a laser drilling apparatus.

The minimum diameter for the non-through holes 117 obtainable when the drilling apparatus 130 comprises a CNC milling machine may be about 0.03 mm, and the position accuracy in the depth (thickness) direction of the leadframe is about 0.004 mm, and the position accuracy in the planar (xy) direction is also about 0.004 mm. Drilling will generally not dent (or bend) the leadframe because the leadframe is generally in a sheet form shown as a roll of sheet material 135 in FIG. 1A which imparts significant mechanical stability. There is also generally a clamper to the leadframe during the drilling process to improve the mechanical stability of the leadframe.

As known in the art of milling, a CNC milling apparatus is known to be a mechanical machining process tool along with drilling, turning, and a variety of other machining processes, meaning that material, generally a metal material such as copper or copper alloy, is removed from a workpiece via mechanical action typically being from actions of the milling machine's cutting tools generally comprising drill bits. The metal debris drilled out emanating from the non-through hole 117 during drilling may be addressed by having a blower apparatus operate during the drilling process to remove the metal debris away from the leadframe. Following the drilling process, there may also be a cleaning process using deionized (DI) water or another chemical such as an alcohol, which is a standard cleaning process in a conventional leadframe process flow.

The position information for drilling the non-through holes 117 for the computerized drilling apparatus 130 can be obtained from a packaging design engineer that considers factors including the area dimensions of the die pad and for the leads or lead terminals, together with considerations for the die pad being to provide sufficient space to mount an IC die (see the IC die 190 shown in FIG. 1D described below) and for the lead or lead terminals to provide space to position the bondwire 162. This position information is generally provided as computer-aided design (CAD) file(s) which can be transferred into a memory associated with the computerized drilling apparatus 130. The translation of the roll of sheet metal 135 by the roller 140 is stopped while the drilling process is taking place.

FIG. 1B is a cross-sectional view of a portion for a die pad 111 of a leadframe 110 that has disclosed non-through holes shown as 117b formed in a die pad 111 after the drilling process depicted in FIG. 1A. Conventional leadframe stamping or etching is then used to form the shape of the leads or lead terminals shown as lead terminals 112 and the die pad 111 according to the package type, with the results shown in FIG. 1C with disclosed non-through holes again shown as 117b in the top side of the die pad 111 and non-through holes 117a in the top side of the lead terminals 112.

Figure 1D:
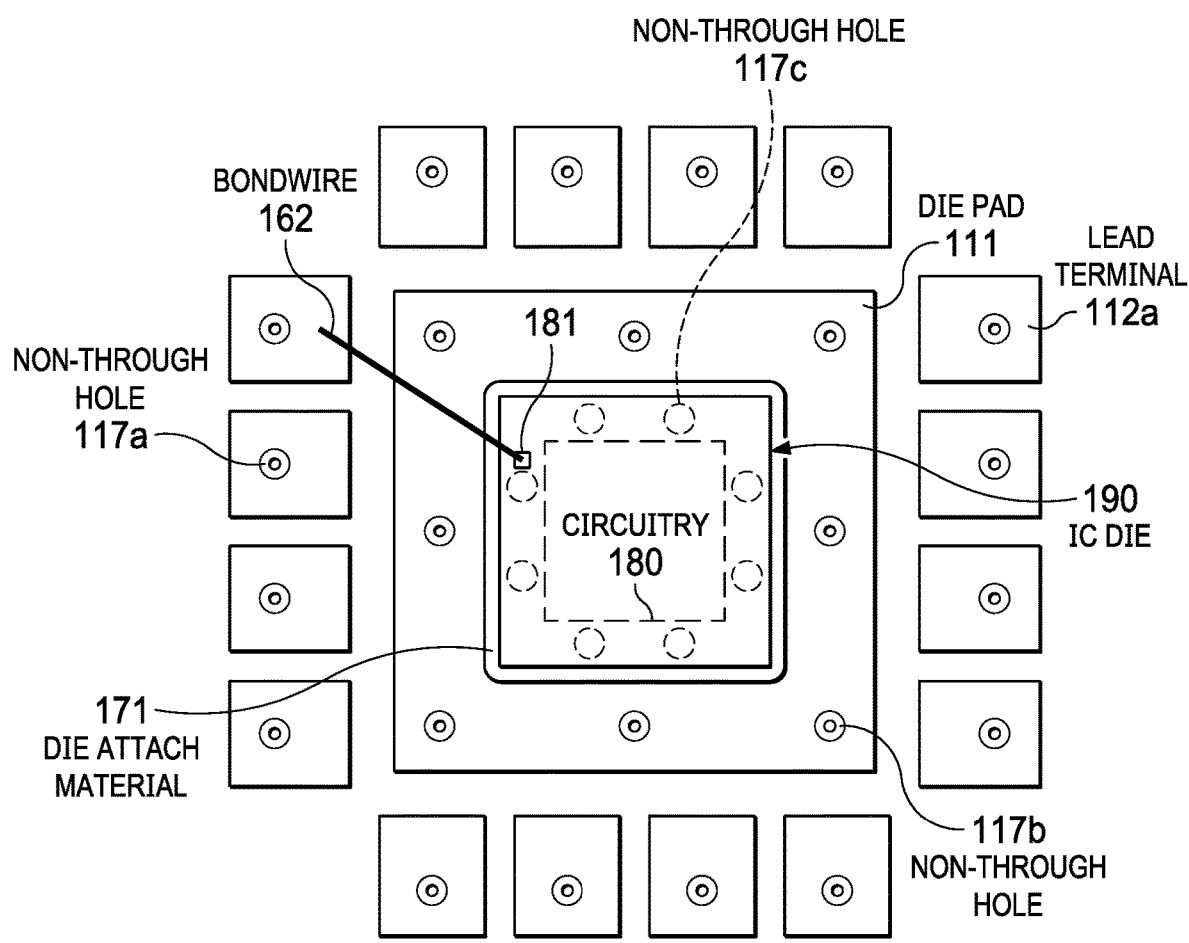
FIG. 1D shows a top view of an IC die on a die pad of a leadframe showing how non-through holes may be distributed across the area of the leads or lead terminals, and across the area of the die pad.

FIG. 1D shows a top view of an IC die 190 on a die pad 111 of a leadframe showing how non-through holes 117a may be distributed across the area of the leads or lead terminals shown as lead terminals with a single lead terminal 112a identified and across the area of the die pad 111 as non-through holes 117b. Optional non-through holes 117c are also shown under the IC die 190. A die attach material 171 is shown attaching the backside of the IC die 190 to the die pad 111 that can fill the non-through holes 117c. The IC die 190 includes circuitry 180 generally comprising transistors and other devices formed on a top side of the IC die configured for a function, with the circuitry having nodes connected to bond pads, with a single bond pad shown as 181 for simplicity. The circuitry 180 comprises circuit elements (including transistors, and generally diodes, resistors, capacitors, etc.) formed in a substrate having at least a semiconductor surface, where the circuit elements are configured together for generally realizing at least one circuit function. Example circuit functions include analog (e.g., amplifier or power converter), radio frequency (RF), digital, or non-volatile memory functions.

Non-through holes 117b are generally positioned near an outer edge of the die pad 111 so that the non-through holes 117b are beyond the area of the IC die 190, and non-through holes 117a are generally positioned relative to the lead or lead terminals to provide space to position a bondwire 162 that couples the lead or lead terminals to the bond pad 181. Although the lead terminals 112a are each shown having a single non-through hole 117a, space permitting in view of the bondwires to be placed, there can be two or more non-through holes 117a in each lead or lead terminal.

Figure 2A:
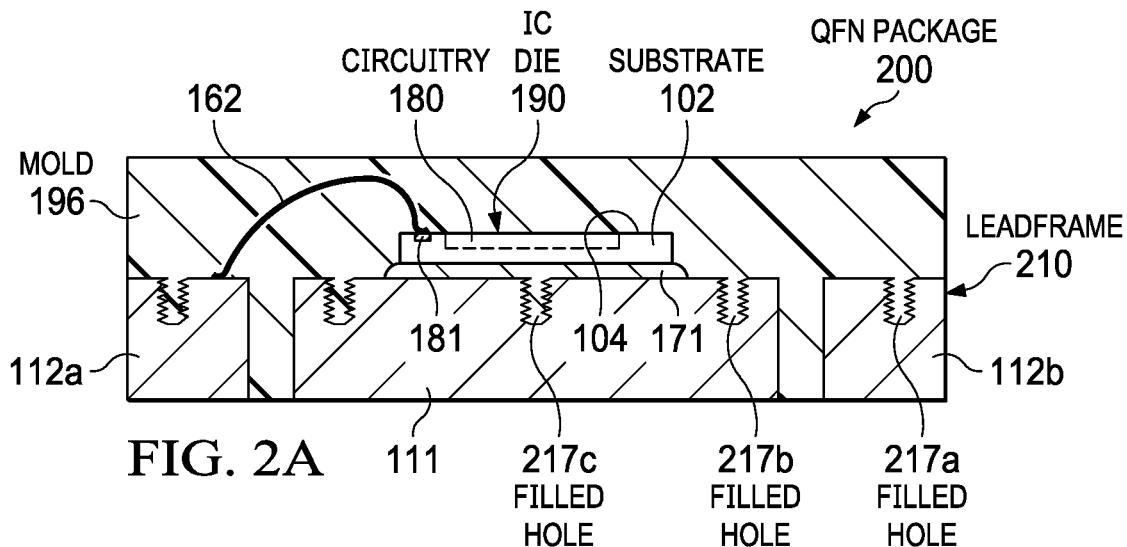
FIG. 2A is a cross-sectional view of an example leadless packaged device shown as a quad flat no lead (QFN) package comprising an IC die mounted top side up on a disclosed leadframe that has non-through holes in both the die pad and in the lead terminals.

FIG. 2A is a cross-sectional view of an example leadless packaged device shown as a QFN package 200 comprising an IC die 190 including a substrate 102 having at least a semiconductor surface layer 104 including circuitry 180 configured for a function, with the circuitry 180 having nodes coupled to bond pads shown as a single bond pad 181 for simplicity. The IC die 190 is mounted top side up on a disclosed leadframe shown as 210 that has filled holes 217c in the die pad 111 that are filled with die attach material 171, filled holes 217b in the die pad 111 that are filled with mold material 196, and filled holes 217a in the lead terminals 112a, 112b that are filled with the mold material 196. The bottom side of the IC die 190 is shown attached to the die pad 111 by the die attach material 171. The die attach material 171 can for example comprise solder.

There is a mold compound 196 shown as mold providing encapsulation for the QFN package 200 except for at least the bottom surfaces of the lead terminals 112a, 112b. The bottom surface of the die pad 111 is also shown exposed by the mold compound 196 to provide better thermal performance for the QFN package 200.

The filled holes 217a in the lead terminals 112a, 112b improve the mold lock of the mold compound 196 to the lead terminals 112a, 112b, which provides a reduction in the delamination risk. The lead terminal 112b is not connected to the IC die 190 by a bondwire 162, and thus functions as a heatsink for the QFN package 200. The filled holes 217c in the die pad 111 having die attach material 171 therein (such as solder) under the bottom side of the IC die 190 provides a delamination risk reduction for the IC die 190 relative to the die pad 111. The filled holes 217b in the die pad 111 beyond the area of the IC die 190 improve the mold lock of the mold compound 196 to the die pad 111 providing a delamination risk reduction, further improving the joint robustness between die pad 111 and the bottom side of the IC die 190. As noted above, a bondwire 162 is shown between the bond pad 181 and a lead terminal 112a. Although no solder is shown on the lead terminal 112a under the bondwire 162, solder can optionally be added there, although the bondwire will generally sufficiently stick to the surface of the lead terminal by force alone.

Figure 2B:
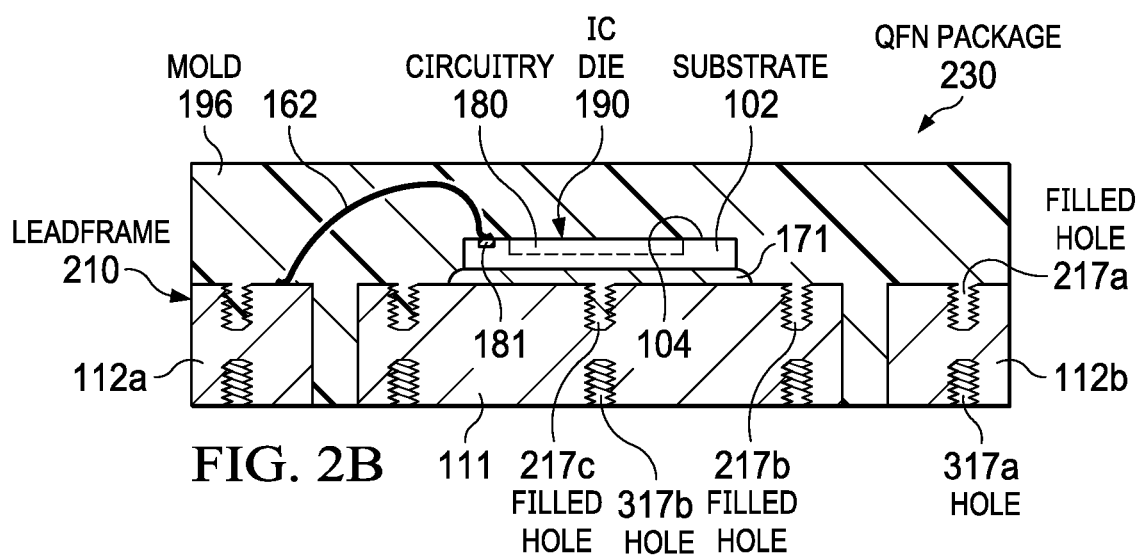
FIG. 2B is a cross-sectional view of an example leadless packaged device shown as a QFN package comprising an IC die mounted top side up on a disclosed leadframe that has on its top side non-through holes in the die pad and non-through holes in the lead terminals like the QFN package shown in FIG. 2A. The QFN package also includes non-through holes on its bottom side including non-through holes in the die pad, and non-through holes in the lead terminals.

FIG. 2B is a cross-sectional view of an example leadless packaged device shown as a QFN package 230 comprising an IC die 190 mounted top side up on a disclosed leadframe that has on its top side non-through holes 217b and 217c in the die pad 111 and non-through holes 217a in the lead terminals 112a, 112b like the QFN package 200 shown in FIG. 2A. The QFN package 230 also includes non-through holes on its bottom side including non-through holes 317b in the die pad 111, and non-through holes 317a in the lead terminals 112a, 112b.

Figure 3:
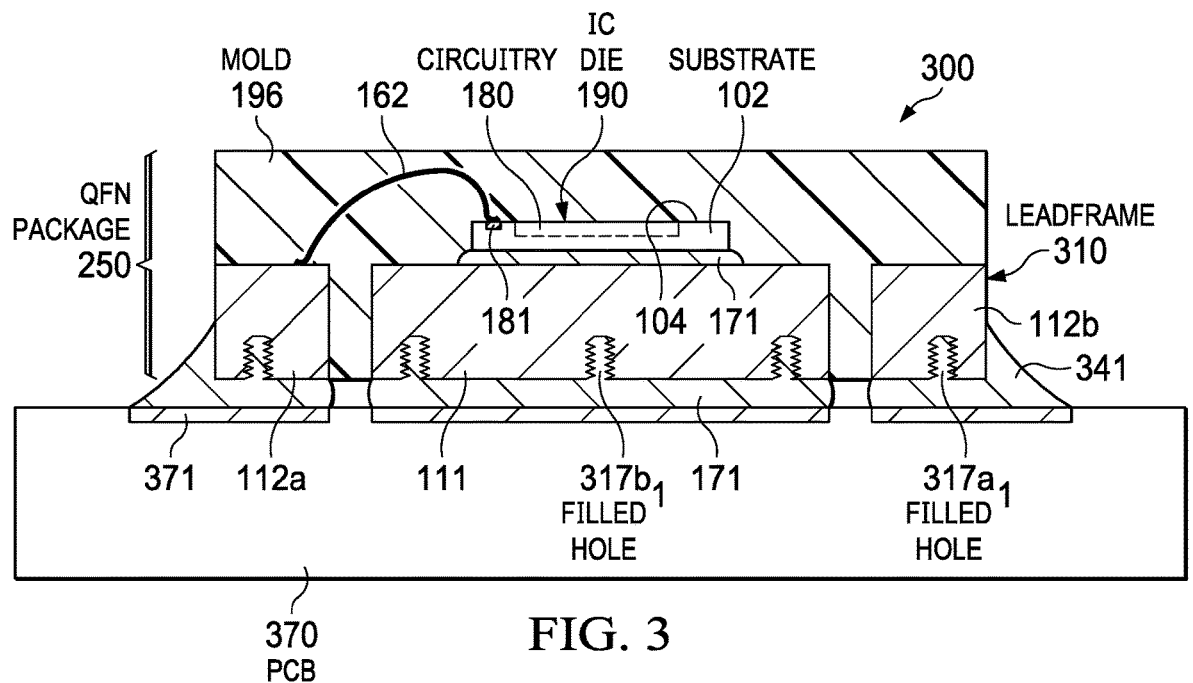
FIG. 3 is a cross-sectional view of an electronic assembly comprising an example leadless package shown as QFN package comprising an IC die on an example leadframe that has filled non-through holes in both the die pad and in the lead terminals, with the IC die shown mounted with its bottom side down onto land pads of a PCB by a solder joint.

FIG. 3 is a cross-sectional view of an example electronic assembly 300 comprising a leadless package shown as QFN package 250. QFN package 250 comprises an IC die 190 including a substrate 102 with a top side semiconductor surface layer 104 having circuitry 180 configured for a function coupled to bond pads shown as 181 mounted top side up on an example leadframe 310 having on its bottom side solder filled holes $317a_1$ under the lead terminals 112a and 112b and solder filled holes $317b_1$ under the die pad 111. The die attach material 171 in this arrangement generally comprises solder. The QFN package 250 is shown mounted with its bottom side down onto the land pads 371 of a PCB 370 by a solder joint 341 that can comprise the same solder material as the die attach material 171.

EXAMPLES

Disclosed aspects are further illustrated by the following specific Examples, which should not be construed as limiting the scope or content of this Disclosure in any way.

Figure 4:
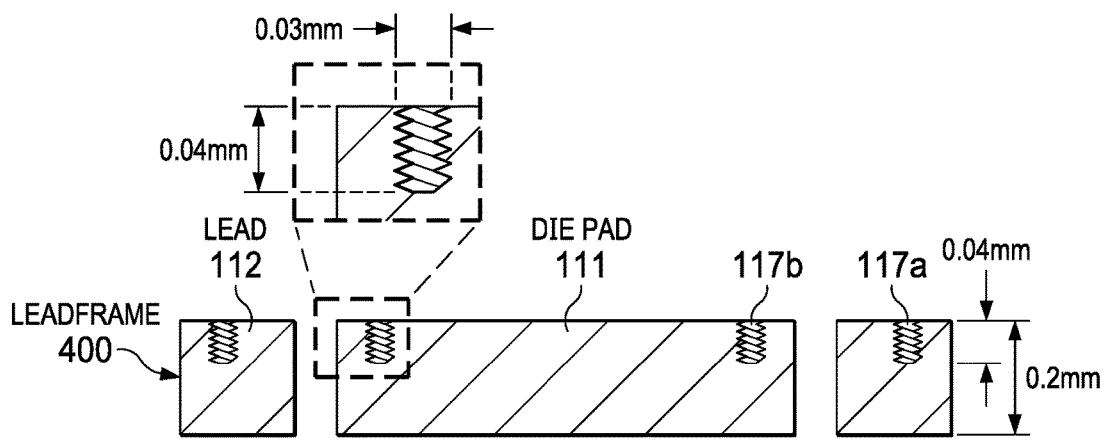
FIG. 4 shows example dimensional details for delamination preventing non-through holes formed in a disclosed QFN leadframe.

FIG. 4 shows example dimensional details for disclosed non-through holes for a disclosed QFN leadframe 400. The thickness of the QFN leadframe 400 is shown as being 0.20 mm, and the depth of the non-through holes 117a, 117b is shown as being 0.04 mm. The width of the non-through holes 117a, 117b including their threading is shown as being 0.03 mm.

Disclosed aspects can be integrated into a variety of assembly flows to form a variety of different packaged semiconductor devices and related products. The assembly can comprise single semiconductor die or multiple semiconductor die, such as comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:
1. A leadframe, comprising:
   a die pad, and
   a plurality of leads or lead terminals on at least two sides of the die pad, wherein the die pad includes at least one non-through circular hole having a thread pattern.
2. The leadframe of claim 1, wherein there is at least one of the non-through circular holes in both the die pad and in at least one of the plurality of leads or at least one of the plurality of lead terminals.
3. The leadframe of claim 1, wherein a depth of the non-through circular hole is from 10% to 70% of a thickness of the leadframe.
4. The leadframe of claim 1, wherein the leadframe comprises a leadless leadframe wherein at least bottom surfaces of the lead terminals are exposed.
5. The leadframe of claim 1, wherein the leadframe comprises a leaded leadframe.
6. The leadframe of claim 1, wherein there is at least one of the non-through circular holes in the die pad at an inner location and at an outer location, and in at least one of the plurality of leads or at least one of the plurality of lead terminals.
7. A leadframe, comprising:
   a die pad, and
   a plurality of leads or lead terminals on at least two sides of the die pad, wherein the die pad includes at least one non-through hole having a thread pattern, wherein there is at least one of the non-through holes on both a top side of the leadframe and on a bottom side of the leadframe.
8. A packaged semiconductor device, comprising:
   a semiconductor die having a top side including a semiconductor surface layer having circuitry configured for a function coupled to bond pads, and a bottom side;

a leadframe comprising a die pad and leads or lead terminals on at least two sides of the die pad, further comprising at least one non-through circular hole for delamination prevention in the die pad;

wherein the semiconductor die is mounted by a die attach material with the bottom side down on the die pad, and a mold compound for providing encapsulation for the packaged semiconductor device, wherein the non-through hole is a filled hole that is filled with either the die attach material or the mold compound.

9. The packaged semiconductor device of claim 8, wherein the filled non-through circular hole has a thread pattern.

10. The packaged semiconductor device of claim 8, wherein there is at least one of the filled non-through circular holes in both the die pad and in the leads or in the lead terminals.

11. The packaged semiconductor device of claim 8, wherein a depth of the filled non-through circular hole is 10% to 70% of a thickness of the leadframe.

12. The packaged semiconductor device of claim 8, wherein the filled non-through circular hole is in at least one of the plurality of leads or at least one of the plurality of lead terminals, and the filled non-through circular hole is filled with the mold compound.

13. A packaged semiconductor device, comprising:
a semiconductor die having a top side including a semiconductor surface layer having circuitry configured for a function coupled to bond pads, and a bottom side;
a leadframe comprising a die pad and leads or lead terminals on at least two sides of the die pad, further comprising at least one non-through circular hole for delamination prevention in the die pad;
wherein the semiconductor die is mounted by a die attach material with the bottom side down on the die pad;
a mold compound for providing encapsulation for the packaged semiconductor device; and
wherein the non-through hole is a filled hole that is filled with either the die attach material or the mold compound, wherein the die attach material comprises solder, wherein the filled non-through circular hole is in the die pad, and wherein the filled hole is filled with the solder.

14. The packaged semiconductor device of claim 8, wherein at least one of the leads or the lead terminals is configured as a heatsink terminal, and wherein the filled non-through circular hole in the heatsink terminal is filled with the mold compound.

15. The packaged semiconductor device of claim 8, wherein a depth of the filled hole is 10% to 70% of a thickness of the leadframe.

16. The packaged semiconductor device of claim 8, further comprising bondwires from the bond pads to the leads or to the lead terminals.

17. The packaged semiconductor device of claim 8, wherein the encapsulation is excluded except for at least a bottom side of the lead terminals or sidewalls of the packaged semiconductor device or for an opening for the leads.

18. The packaged semiconductor device of claim 8, wherein there is at least one of the non-through holes in the die pad at an inner location and at an outer location, and in the lead or in the lead terminal.

19. A packaged semiconductor device, comprising:
a semiconductor die having a top side including a semiconductor surface layer having circuitry configured for a function coupled to bond pads, and a bottom side;
a leadframe comprising a die pad and leads or lead terminals on at least two sides of the die pad, further comprising at least two non-through holes for delamination prevention in the die pad;
wherein the semiconductor die is mounted by a die attach material with the bottom side down on the die pad;
a mold compound for providing encapsulation for the packaged semiconductor device; and
wherein the non-through holes are filled with either the die attach material or the mold compound, wherein there is at least one of the non-through holes on both a first side of the leadframe and another one of the non-through holes on an opposing second side of the leadframe.

20. A method of fabricating leadframes, comprising:
providing a leadframe sheet including a plurality of leadframe sites each including a die pad, and a plurality of leads or lead terminals on at least two sides the die pad;
drilling to form non-through holes in a top and a bottom side of the die pad; and
stamping or etching to shape the leads or the lead terminals and the die pad.

21. The method of claim 20, wherein the drilling comprises computer numerical control (CNC) milling.

22. The method of claim 20, wherein a depth of the non-through holes is 10 percent to 70 percent of a thickness of the leadframe sites.

23. The method of claim 20, wherein the non-through holes comprise a thread pattern.

24. The method of claim 20, wherein the die pad and the plurality of leads or lead terminals both include the non-through holes.

25. The method of claim 20, wherein the stamping or etching is performed according to a type of the leadframe sites.

26. The method of claim 20, wherein the drilling comprises forming at least one of the non-through holes in the die pad at an inner location and at an outer location, and in the lead or in the lead terminal.

27. The method of claim 20, wherein the drilling comprises forming at least one of the non-through holes on both a top side of the leadframe sites and on a bottom side of the leadframe sites.

28. The method of claim 20, wherein the non-through holes have non-planar bonding surfaces.

29. The packaged semiconductor device of claim 8, wherein one side of the lead frame remains uncovered by the mold compound.

30. The packaged semiconductor device of claim 19, wherein one of the first and second sides of the lead frame remains uncovered by the mold compound.

31. A packaged semiconductor device, comprising:
a semiconductor die having a top side including a semiconductor surface layer having circuitry configured for a function coupled to bond pads, and a bottom side;
a leadframe comprising a die pad and leads or lead terminals on at least two sides of the die pad, further comprising at least one non-through circular hole in the die pad;
wherein the semiconductor die is mounted by a die attach material with the bottom side down on the die pad; and
a mold compound for providing encapsulation for the packaged semiconductor device, the mold compound not covering the at least one non-through circular hole in the die pad.

* * * * *